(12) United States Patent
De La Prieta et al.

(10) Patent No.: US 6,803,093 B2
(45) Date of Patent: Oct. 12, 2004

(54) CERAMIC BLANK WITH A PHOTOSTRUCTURABLE FUNCTIONAL LAYER CONTAINING PLATINUM AND METHOD FOR PRODUCTION THEREOF

(75) Inventors: Claudio De La Prieta, Stuttgart (DE); Thomas Schulte, Stuttgart (DE); Uwe Glanz, Asperg (DE); Petra Kuschel, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/979,457

(22) PCT Filed: May 8, 2001

(86) PCT No.: PCT/DE01/00866

§ 371 (c)(1),
(2), (4) Date: Mar. 14, 2002

(87) PCT Pub. No.: WO01/69318

PCT Pub. Date: Sep. 20, 2001

(65) Prior Publication Data

US 2003/0026961 A1 Feb. 6, 2003

(30) Foreign Application Priority Data

Mar. 14, 2000 (DE) .......................................... 100 12 245

(51) Int. Cl.⁷ ............................ B32B 3/00; G03F 7/028; G03F 7/033
(52) U.S. Cl. .................... 428/210; 252/514; 156/89.12; 430/18; 430/84
(58) Field of Search ................................ 428/210, 209; 430/18, 84; 252/514; 156/89.12; 124/255

(56) References Cited

U.S. PATENT DOCUMENTS 3,732,792 A * 5/1973 Tarnopol et al. .............. 95/1 R
5,009,708 A * 4/1991 Grunwald et al. .......... 106/105
5,010,315 A * 4/1991 Fedter et al. ................... 338/7
6,156,237 A * 12/2000 Kubota et al. .............. 252/512
6,169,275 B1 * 1/2001 Noda et al. ................. 219/552
6,391,678 B1 * 5/2002 Paszkiet et al. ............. 438/106

FOREIGN PATENT DOCUMENTS

| DE | 199 34 109 | | 4/2001 |
| EP | 0 569 762 | | 11/1993 |
| FR | 2 796 718 | | 1/2001 |
| LT | 4534 B | * | 8/1999 |
| LT | 97 161 | | 8/1999 |

OTHER PUBLICATIONS

Masaki et al., *Photosensitive Conductive Paste*, Proc. IEEE CPMT Int. Electronic Manufacturing Technology Symposium, Tokyo, Japan, Apr. 16–18, 1997.

Draudt et al., *Photoimageable Silver Cofireable Conductor Compatible with 951 Green Tape/Sup Tm*, 12ᵗʰ European Microelectronics and Packaging Conference Proceedings, Harrogate, UK, Jun. 7–9, 1999, pp. 219–226.

* cited by examiner

Primary Examiner—Cathy Lam
(74) Attorney, Agent, or Firm—Kenyon & Kenyon

(57) ABSTRACT

A green ceramic body, in particular a green ceramic film having a function layer which contains platinum and is applied in at least some areas is described; this function layer is photostructurable in daylight and in the presence of oxygen. In addition, a method of producing such a green ceramic body is described, including the process steps: a) making available a green ceramic starting body, b) applying a photostructurable paste containing platinum to the starting body in at least some areas, in particular by printing, in daylight and in the presence of oxygen, and c) photostructuring the applied paste to form the function layer. The green ceramic body described here is suitable in particular for further processing to form a temperature sensor.

14 Claims, 1 Drawing Sheet

US 6,803,093 B2

CERAMIC BLANK WITH A PHOTOSTRUCTURABLE FUNCTIONAL LAYER CONTAINING PLATINUM AND METHOD FOR PRODUCTION THEREOF

FIELD OF THE INVENTION

The present invention relates to a green ceramic body, in particular a green ceramic film having a photostructurable function layer containing platinum and a method of producing such a green ceramic body.

BACKGROUND INFORMATION

The Fodel technology developed by DuPont is already known for producing structured resistance layers or printed conductors on green ceramic bodies, which are designed in a zigzag or meandering pattern, for example, in some areas.

In particular, a paste is printed onto green ceramic films and subsequently structured by using a photomask and exposing with UV rays. This structuring is then followed by developing the paste in the exposed areas. However, a disadvantage of this technology is that a yellow room is always necessary because the pastes are sensitive to daylight. In addition, the known pastes based on the Fodel technology are suitable only for maximum temperatures of 900° C., i.e., the green ceramic films to which the structured pastes have been applied can then be fired or sintered at max. 900° C. However, these temperatures are often not sufficient Moreover, it is not possible with the Fodel technology to simultaneously produce coarse and very fine structuring on the green films. Finally, such pastes have only a limited suitability for producing function layers containing platinum and they are often sensitive to oxygen.

In addition, it is also known that pastes containing platinum can be applied instead of green ceramic films to ceramic substrates which have already been fired and which can then be provided with structured function layers by photostructuring. This method permits fine structuring down to a lateral dimension of approx. 10 $\mu$m, while only structures having a lateral extent greater than 100 $\mu$m can be produced by the traditional screen printing technology.

German Published Patent Application No. 199 34 109 describes the manufacture of a temperature sensor, where meandering printed conductors or resistor paths of platinum are first printed on green ceramic films, then are built up in the form of a multilayer hybrid using additional green ceramic films and next are sintered to form a temperature sensor by the cofiring technology. However, only printed conductor widths and spacings of approx. 0.2 mm can be achieved because of the thick film technology used here.

Due to the fact that known photostructurable function layers containing platinum can be applied only to prefired ceramics and can be processed only with a very complicated process technology (nitrogen atmosphere, yellow room, etc.), they cannot be integrated into existing manufacturing methods.

In this regard, Lithuanian Published Patent Application No. 97 161 has already described a photostructurable paste containing platinum which is suitable for application to prefired ceramic films and can be structured by photostructuring after application to form a function layer containing platinum. The typical lateral structure resolution is 10 $\mu$m to 30 $\mu$m.

The object of the present invention was to modify the photostructurable paste described in Lithuanian Published Patent Application No. 97 161 so that it is also suitable for direct application to green ceramic films and thus for producing a green ceramic body having a photostructurable function layer containing platinum that can be processed without any great process technological complexity. At the sane time, the object of the present invention is to permit a definite increase in the structural resolution of the function layer while at the same time retaining the cofiring technology for production of multilayer structures and multilayer hybrids. This should permit the simplest possible integration into existing production lines.

SUMMARY OF THE INVENTION

The green ceramic body according to the present invention and the method according to the present invention for producing a green ceramic body has the advantage in comparison with the related art that green ceramic films can be provided directly with photostructurable function layers containing platinum in this way. These function layers can also be structured by photostructuring in the form of printed conductors or resistor paths in particular, yielding a lateral resolution of less than 15 $\mu$m, in particular between 5 $\mu$m and 25 $\mu$m, in the resulting structures of the function layer.

In addition to a high absolute lateral resolution of the structures created in the photostructured function layers, the green ceramic body according to the present invention has the advantage that photostructuring can be performed in daylight and in the presence of oxygen. Thus, the green ceramic body and the method of producing same can easily be integrated into existing manufacturing processes, yielding significant cost advantages in comparison with known methods involving much more complex technologies.

It is also advantageous that the structures remaining on the green ceramic body after photostructuring of the function layer have only a low standard deviation from a given specified value in the lateral extent of the resulting structures in at least one dimension. To this extent, structures wider than 50 $\mu$m can also be created, but they would then have a very precisely defined width, for example. The standard deviation from the specified value is preferably less than 10 $\mu$m, in particular less than 5 $\mu$m.

The green ceramic body according to the present invention is suitable for producing multilayer ceramic-based structures in an advantageous manner, the green ceramic body having the applied photostructured function layers also being processable to hybrid components. In addition, it is also readily possible to provide the green ceramic body with recesses and/or plated-through holes or superficial contact areas before or after applying the function layer.

Finally, the green ceramic body according to the present invention also makes it possible to manufacture the temperature sensor known from German Published Patent Application No. 199 34 109 having improved properties with regard to the resistor paths produced in this way. Furthermore, the function layer applied is very stable over time despite the addition of platinum, which has a very high catalytic activity.

For example, instead of pure platinum powder, a mixture of platinum powder with aluminum oxide powder and/or zirconium dioxide powder is also suitable as a filler in the paste applied to the green ceramic body in the form of a function layer. This mixture results in improved adhesion of the resulting function layers containing platinum to the starting green ceramic body or the starting green ceramic film ("green tape") and/or it increases the electric resistance of the printed conductors structured in the function layer after photostructuring due to the mixture of platinum and aluminum oxide powder particles.

It is also advantageous that the photostructurable paste applied to the starting green ceramic body can be developed by an aqueous solution.

Thus, on the whole this yields a greatly improved resolution in the resulting structures of the function layer, and the ceramic substrates fired after conclusion of sintering of the green body may have resistor paths in a meandering structure, for example, having an increase in resistance of more than 400% in comparison with comparable resistor paths produced by the traditional thick film technology. Such resistor paths mean a much smaller area required with a much better accuracy of the temperature measurement and a higher measurement resistance, i.e., a better accuracy in analysis of the measurement voltage when used in temperature sensors or heating elements.

Because of the increased resolution in photostructuring of the function layer, the fluctuations in resistance values of the resulting resistor paths are also greatly reduced, thus yielding on the whole a higher manufacturing quality, fewer rejects and smaller deviations in the resulting resistance values from a given specified value.

DETAILED DESCRIPTION

Figure 1:
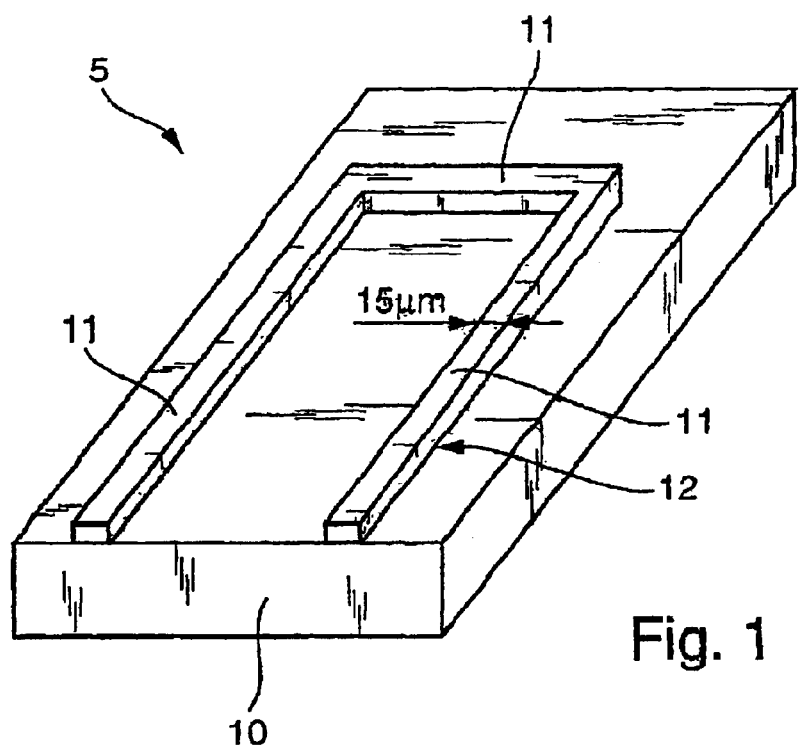
FIG. 1 shows a schematic diagram of a section of a green ceramic body having an applied photostructured function layer.

The present invention is based first on a photostructurable paste such as that known in a similar form from Lithuanian Published Patent Application No. 97 161. However, the paste described there is suitable only for application to prefired ceramic substrates and must be modified for application to green ceramic film. This modification is based essentially on the fact that in the case of the paste composition known from Lithuanian Published Patent Application No. 97 161, the glass components in the form of glass powder particles as required there are removed or are not added when mixing the paste.

It has surprisingly been found that the photosensitive or photostructurable paste known from Lithuanian Published Patent Application No. 97 161 is suitable for direct application to green ceramic bodies when the composition described there is modified by omitting the glass powder constituents. In addition, it has been found that a photosensitive paste modified in this way allows direct production of structured function layers on green ceramic film, the lateral extent of the structures produced in these function layers by photostructuring being less than 50 $\mu$m, in particular between 5 $\mu$m and 25 $\mu$m in at least one dimension, e.g., the width. At the same time, it has been found that if even wider structures are desired, they can be produced with a much greater accuracy. A measure of this accuracy is the standard deviation from a given setpoint in the lateral extent of the resulting structures in at least one dimension. This standard deviation is typically less than 10 $\mu$m, in particular less than 5 $\mu$m.

A platinum powder having a mean particle size of 10 nm to 20 $\mu$m, in particular form 50 nm to 2 $\mu$m, is suitable as the filler for the photostructurable paste used according to the present invention, forming the photostructured function layers after being applied to the green ceramic film. In addition, the specific surface area of the inorganic filler or the platinum powder in the paste is preferably 0.5 $m^2/g$ to 20 $m^2/g$.

The total amount by weight of the inorganic filler in the photostructurable paste is thus between 30% and 90%, based on the total weight of the paste. An amount by weight of 50% to 60% is preferred.

Adding a mixture of platinum powder with a ceramic powder as the inorganic filler to the photostructurable paste is especially preferred. Therefore, the ceramic powder also has a mean particle size of 10 nm to 20 $\mu$m and a specific surface area of 0.5 $m^2/g$ to 20 $m^2/g$, which is comparable to that of the platinum powder. In particular aluminum oxide powder, zirconium dioxide powder, yttrium stabilized zirconium dioxide powder, yttrium oxide powder, titanium dioxide powder, silicon oxide powder or a mixture of these powders may be used as the ceramic powder. In addition, however, platinum sheathed, nonconducting ceramic particles may also be used as the filler. Adding the ceramic powder to the platinum powder yields a much higher resistance per unit of area in production of resistor paths or in structuring them in the function layer with the help of the photostructurable paste. With regard to details concerning this state of affairs, which is known in principle, reference is made to German Published Patent Application No. 199 34 109.

In addition to adding pure platinum as a filler, it is in principle also possible to add platinum compounds, in particular platinum precursor compounds such as platinum (II) acetyl acetonate, platinum(II) diaminocyclobutane-1,1-dicarboxylate, platinum(0) 1,3-divinyl-1,1,3,3-tetramethyldisiloxane or platinum(II) tetraamine nitrate. However, these fillers are not preferred for cost reasons. In addition, instead of the ceramic powder, ceramic precursor materials, in particular organic precursor materials based on Si, Al, Zr, Ti, and Y may also be used. Those skilled in the art will be aware of such precursor materials.

The green ceramic bodies or ceramic films to which the photostructurable paste is applied as a function layer, in particular by printing, are the conventional green ceramic films having ceramic particles, e.g., yttrium stabilized zirconium dioxide particles or aluminum oxide particles embedded in a polymer matrix.

In addition, before applying the photostructurable paste as a photostructured function layer to the green ceramic body, an intermediate layer may be applied to it first in a known way. This intermediate layer may be a layer of $Al_2O_3$ or $TiO_2$, for example.

After applying the photostructurable paste to the green ceramic film in the form of a function layer containing platinum and after photostructuring it by exposing in some areas with the help of a photomask, the function layer is then developed and removed again in the unexposed areas. In this way, the function layer remains only in the exposed areas, thus yielding the desired structuring of the function layer defined by the photomask as desired. Thereafter, it is possible to process further the green ceramic body produced in this way, e.g., to form multilayer hybrid components or the temperature sensor known from German Published Patent Application No. 199 34 109.

Thus, on the whole, it is possible by using the photostructurable paste described in greater detail below to produce structured function layers on green ceramic films that are not sensitive to the visible spectrum of light and the inhibiting effect of oxygen and are characterized by a high rate of photopolymerization and an excellent line resolution. In addition, the paste that is used can be processed with the help of the known thick film technology.

The polymer used in the organic binder is especially important for the paste. This polymer must be a photochemically active polymer, i.e., it not only has the role of a layer-forming component in the binder which also mediates the ability to dissolve, but at the same time it should also effectively initiate photopolymerization through the initiator, which is not sensitive to the visible spectrum of light. To do so, it is formed as a high molecular weight polyfunctional monomer. At the same time, the side chains of the polymer with their allyl groups and the organic disulfide which is also used in the organic binder neutralize the inhibiting effect of oxygen. This guarantees that all the technological operations, i.e., preparing the photosensitive organic binder, mixing it with the filler, applying the resulting paste as a function layer to the green ceramic film, then drying, photostructuring and developing, can be performed in daylight or under ordinary artificial lighting. In addition no special measures are required to prevent contact of the photostructured function layers with atmospheric oxygen.

In the process of polymerization, the linear macromolecules of the polymer used in the binder of the paste, having side chains with alkyl groups and allyl groups, form a dense three-dimensional structure, so that the polymer becomes completely insoluble in aqueous solvents in the area of the exposed sites. The exposure time is also especially short due to the added photoinitiator from the acylphosphine class.

Thus, on the whole, the photostructurable paste has the following composition in amounts by weight, based on the weight of the inorganic filler.

| filler: | 100.00 |
| --- | --- |
| polymer: | 9.00 to 36.00 |
| photoinitiator: | 0.50 to 3.50 |
| organic disulfide: | 0.20 to 2.00 |
| inhibitor of thermal polymerization: | 0.01 to 0.35 |
| organic solvent: | 5.50 to 21.50 |

A number of demands are made regarding the polymer contained in the organic binder. First, it should be soluble in water-soluble base solutions, it should form a nonadhesive skin or membrane at room temperature, it should make the viscosity of the photostructurable paste adjustable and it should participate actively in the photo-initiated, radical polymerization in an environment containing oxygen. Finally, thermal cleavage of the polymer should take place even at the lowest possible temperatures.

These requirements are best met by acrylic or vinyl monomers and unsaturated carboxylic acid copolymers, where the molecular weight is preferably between 10,000 and 20,000, and the weight of the unsaturated carboxylic acid in the copolymer is between 15 and 30 wt %. With regard to additional details regarding the requirements and possibilities for the polymers which can be used in various ways, reference is made to Lithuanian Published Patent Application No. 97 161.

Since the polymers that can be used have side chains having acryl groups and allyl groups, they greatly reduce the sensitivity of the organic binder to the inhibitory effect of oxygen, but they do not eliminate it completely. Therefore, an organic disulfide is added which has the general formula $R_1-CH_2-S-S-CH_2-R_2$ where $R_1$, $R_2$ stand for the same or different alkyl, cycloalkyl, aryl, arylalkyl or carboxyalkyl radicals. Dodecyl disulfide is especially suitable as the organic disulfide.

A photoinitiator from the acylphosphine class is added to the photostructurable paste. The compound 2,6-dimethoxybenzoyl-diphenylphosphine is preferred.

The solvent which is added to adjust the viscosity of the photostructurable paste should dissolve all the organic components very well, while having a low volatility at room temperature and volatilizing relatively rapidly at temperatures of 80° C.–100° C., because such temperatures are typically used in drying green ceramic films, in particular after applying the photostructurable paste in the form of the function layer.

Preferred solvents include terpenes, carbitol acetate, butyl carbitol acetate or higher alcohol esters. Benzyl alcohol is especially preferred. To ensure the stability of the function layer during the drying process, an inhibitor is added to the paste for thermal polymerization. The compound 2,6-di-tert-butyl-1,4-cresol has proven to be an especially suitable inhibitor.

The individual components of the photostructurable paste were processed essentially as already indicated in Lithuanian Published Patent Application No. 97 161, where the components of the organic binder were first stirred with the filler, e.g., in a three-roll mill, to thereby guarantee a uniform distribution of filler particles in the organic binder. The photostructurable paste prepared in this way is then applied in a typical thickness of 500 nm to 20 μm to a green ceramic film with aluminum oxide as the ceramic component.

Then the green films provided with the function layer in this way are dried at a temperature of 80° C. to 100° C., typically for a period of 5 min to 20 min, and finally exposed with UV light through a photomask. For this purpose, the photomask is structured in the form of meandering resistor paths, for example, in a known way.

The UV light in exposure preferably has a wavelength of 320 nm to 400 nm.

After exposing the areas of the function layer on the green ceramic film not covered with the photomask, the function layer or the photostructurable paste forming it is developed. To do so, an aerosol of an aqueous 0.5% monoethanolamine solution is applied by drops to a substrate on which the exposed green ceramic films are arranged and which is rotating at a rate of typically 3000 rpm. This method is generally known as "spin development" and is described in greater detail in Lithuanian Published Patent Application No. 97 161.

Finally, after developing the photostructurable paste, the unexposed areas of the function layer are washed off again with the help of a water-soluble base solution.

The green ceramic films with the developed photostructured function layers on them are then processed further in the manner described in German Published patent application Ser. No. 199 34 109. Thus, the green ceramic films provided with the structured function layers are optionally stacked with other green ceramic films, provided with plated-through holes and electric terminals and finally sintered at temperatures of typically 1050° C. to 1650° C., e.g., to form a temperature sensor.

FIG. 1 shows a typical green ceramic film as a starting body 10 to which a photostructurable function layer 12 containing platinum is applied with a typical thickness of 5 μm to 20 μm by printing in the manner described above. This function layer 12 was then photostructured with the help of a photomask in the manner described above, so that structures 11 in the form of meandering printed conductors were structured in function layer 12. These structures 11 have a typical lateral extent of 15 μm. Starting body 10 having structured function layer 12 applied is then assembled according to FIG. 2 with additional green ceramic films to form a stacked green ceramic body and then sintered, resulting in a temperate sensor 5, such as that already known in principle from German Published patent application Ser. No. 199 34 109. In this sense, FIG. 1 is only a detail of starting body 10 according to FIG. 2.

Figure 2:
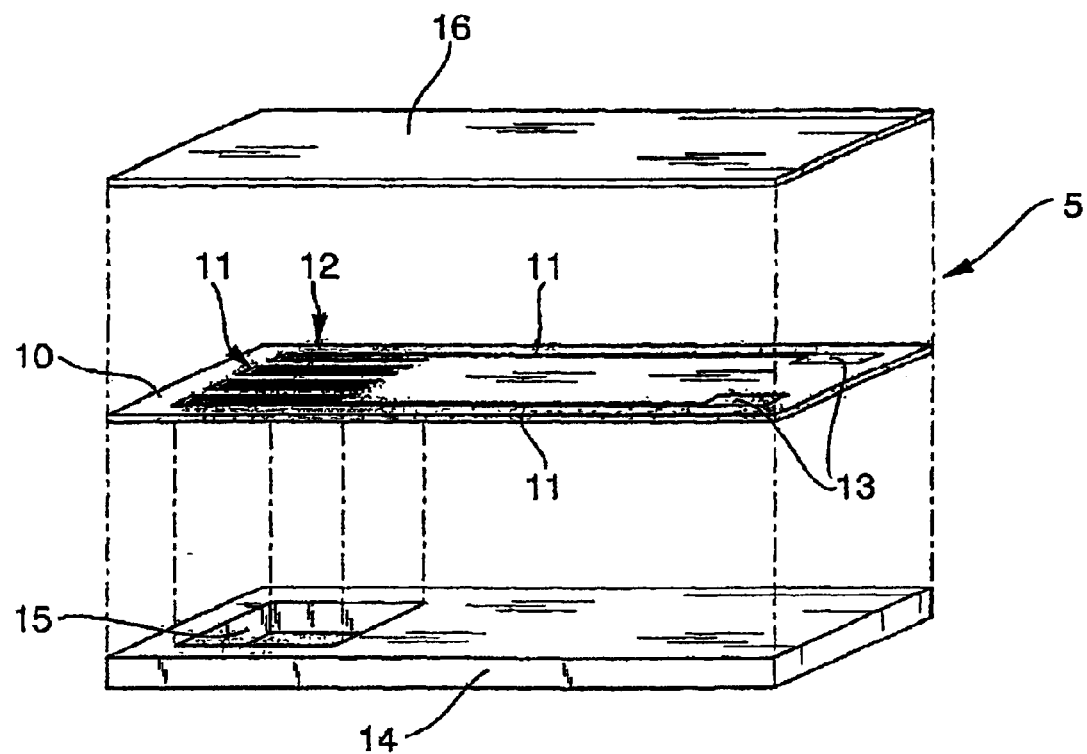
FIG. 2 shows an exploded diagram of a temperature sensor having a green ceramic body with a photostructured function layer containing platinum in the form of resistor paths.

FIG. 2 shows temperature sensor 5 to be produced in an exploded diagram, where starting body 10 in the form of a green ceramic film has been provided first with photostructurable function layer 12 containing platinum. Function layer 12 has structures 11 in the form of meandering resistor paths on the surface of starting body 10 for electric contacting of contact areas 13. A green ceramic backing film 14 provided on the bottom side of starting body 10 has a recess 15. The top side of starting body 10 is covered by a green ceramic cover film 16. Backing film 14 and cover film 16 preferably have the same composition as starting body 10.

With regard to details concerning the function and structural details of temperature sensor 5, reference is made to German Published Patent Application No.199 34 109. After joining starting body 10, which has been provided with function layer 12, to backing film 14 and cover film 16, the resulting stacked green ceramic body is subjected to a thermal treatment in which the polymer matrix of the green films at least undergoes extensive thermal decomposition and/or is evaporated, and the green ceramic films are sintered at temperatures between 1050° C. and 1650° C. Starting body 10 thus yields a fired ceramic film having to resistor paths formed by structures 11.

What is claimed is:

1. A green ceramic structure, comprising:

a green ceramic film; and a function layer applied in at least one area of the green ceramic film, wherein:
the function layer is free of glass constituents, and the function layer includes platinum, a polymer having acrylic and allyl groups, an organic disulphide and thermal polymerization inhibitor, so that the function layer is photostructurable in daylight and in a presence of oxygen.

2. The green ceramic structure according to claim 1, wherein:

the green ceramic film includes ceramic particles embedded in a polymer matrix, the ceramic particles including at least one of yttrium-stabilized $ZrO_2$ particles and $Al_2O_3$ particles.

3. The green ceramic structure according to claim 1, wherein:

the function layer is 500 nm to 40 μm thick.

4. The green ceramic structure according to claim 1, wherein:

the function layer includes structures whose width is less than 50 μm.

5. The green ceramic structure according to claim 4, wherein:

the width is between 3 μm and 20 μm in at least some areas.

6. The green ceramic structure according to claim 4, wherein:

a standard deviation of the width of the structures of the function layer is less than 10 μm.

7. The green ceramic structure according to claim 4, wherein:.

a standard deviation of the width of the structures of the function layer is less than 5 μm.

8. The green ceramic structure according to claim 4, wherein:

the structures include at least one of: printed conductors that are one of zigzag and meandering; and resistor paths that are one of zigzag and meandering.

9. The green ceramic structure according to claim 1, further comprising:

at least one intermediate layer arranged between the function layer and the green ceramic film, wherein the at least one intermediate layer includes $Al_2O_3$ and is 1 μm to 20 μm thick.

10. A stacked green ceramic structure, comprising:

at least one green ceramic film; and a function layer applied in at least one area of the green ceramic film, wherein:
the function layer is free of glass constituents, and the function layer includes platinum, a polymer having acrylic and allyl groups, an organic disulphide and thermal polymerization inhibitor, so that the function layer is photostructurable in daylight and in a presence of oxygen.

11. A method of producing a ceramic structure, comprising the steps of:

preparing a green ceramic body;

applying a photostructurable paste to at least a portion of the green ceramic body in daylight and in a presence of oxygen, wherein the photostructurable paste is free of glass constituents, and the photostructurable paste includes platinum, a polymer having acrylic and allyl groups, an organic disulphide and thermal polymerization inhibitor; and photostructuring the applied paste.

12. The method according to claim 11, further comprising the step of:

before photostructuring the applied paste, drying the applied paste.

13. The method according to claim 11, wherein:

the photostructuring is performed with the aid of a photomask by exposing to UV light in some areas, then developing and finally removing unexposed areas.

14. The method according to claim 11, further comprising the steps of:

subjecting the green ceramic body and the photostructured paste to a thermal treatment, in which a polymer matrix of the green ceramic body undergoes at least one of extensive thermal decomposition and vaporization; and sintering the green ceramic body and the photostructured paste at a temperature between 1050° C. and 1650° C.

* * * * *